(12) United States Patent
Wu (10) Patent No.: US 7,087,488 B2
(45) Date of Patent: Aug. 8, 2006

(54) METHOD FOR FABRICATING A MASK ROM

(75) Inventor: Yi-Tyng Wu, Chia-I (TW)

(73) Assignee: United Microelectronics Corp., Hsin-Chu (TW)

( * ) Notice: Subject to any disclaimer, the term of this patent is extended or adjusted under 35 U.S.C. 154(b) by 66 days.

(21) Appl. No.: 10/710,505

(22) Filed: Jul. 16, 2004

(65) Prior Publication Data

US 2006/0014348 A1 Jan. 19, 2006

(51) Int. Cl.
*H01L 21/336* (2006.01)

(52) U.S. Cl. .................................... 438/257

(58) Field of Classification Search ........... 438/275, 438/262
See application file for complete search history.

(56) References Cited

U.S. PATENT DOCUMENTS 6,586,303 B1 * 7/2003 Wu ........................ 438/262

2004/0029347 A1 * 2/2004 Chang et al. ............ 438/275

* cited by examiner

*Primary Examiner*—Carl Whitehead, Jr.
*Assistant Examiner*—Monica D. Harrison
(74) *Attorney, Agent, or Firm*—Winston Hsu (57) ABSTRACT

The present invention discloses a method for fabricating a buried bit line of a mask ROM. The method includes providing a semiconductor substrate with a photoresist layer, and patterning the photoresist layer to form a photoresist pattern. A first ion implantation process is performed to form a first doped region in the semiconductor substrate not covered by the photoresist pattern. Then, an organic layer is coated on the photoresist pattern and the semiconductor substrate and an etching process is performed to form an organic spacer at two sides of the photoresist pattern. Finally, a second ion implantation process forms a second doped region in the semiconductor substrate not covered by the photoresist pattern and the organic spacer. Finally, the photoresist pattern and the organic spacer are removed.

11 Claims, 9 Drawing Sheets

Figure 1:
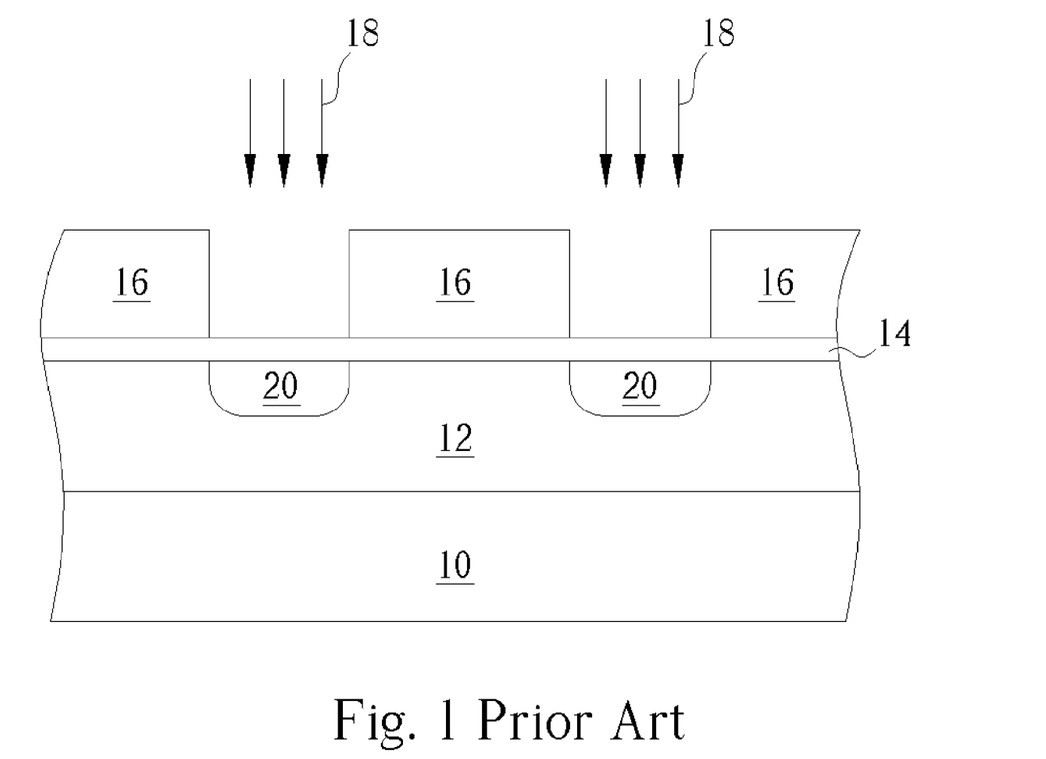
FIGS. 1 and 2 are schematic diagrams showing a method for fabricating buried bit lines of a mask ROM according to the prior art.

Fig. 9 ately oxidized to form a pad oxide layer 14 with a thickness between 125 and 250 angstroms (Å). A photoresist layer (not shown) is coated on the pad oxide layer 14 and patterned as is conventional in the art to form a photoresist mask 16 having openings where buried bit lines 20 are to be formed within the semiconductor substrate 10. An ion implantation process 18 is performed through the photoresist mask 16. Typically, arsenic (As) ions are implanted at a dosage of between $1.5 \times 10^{15}$ and $3 \times 10^{15}$ atoms/cm$^2$ and at an energy level between 40 and 80 KeV to form the buried bit lines 20 within areas of the P-type well 12 which are not shielded by the photoresist mask 16.

Figure 2:
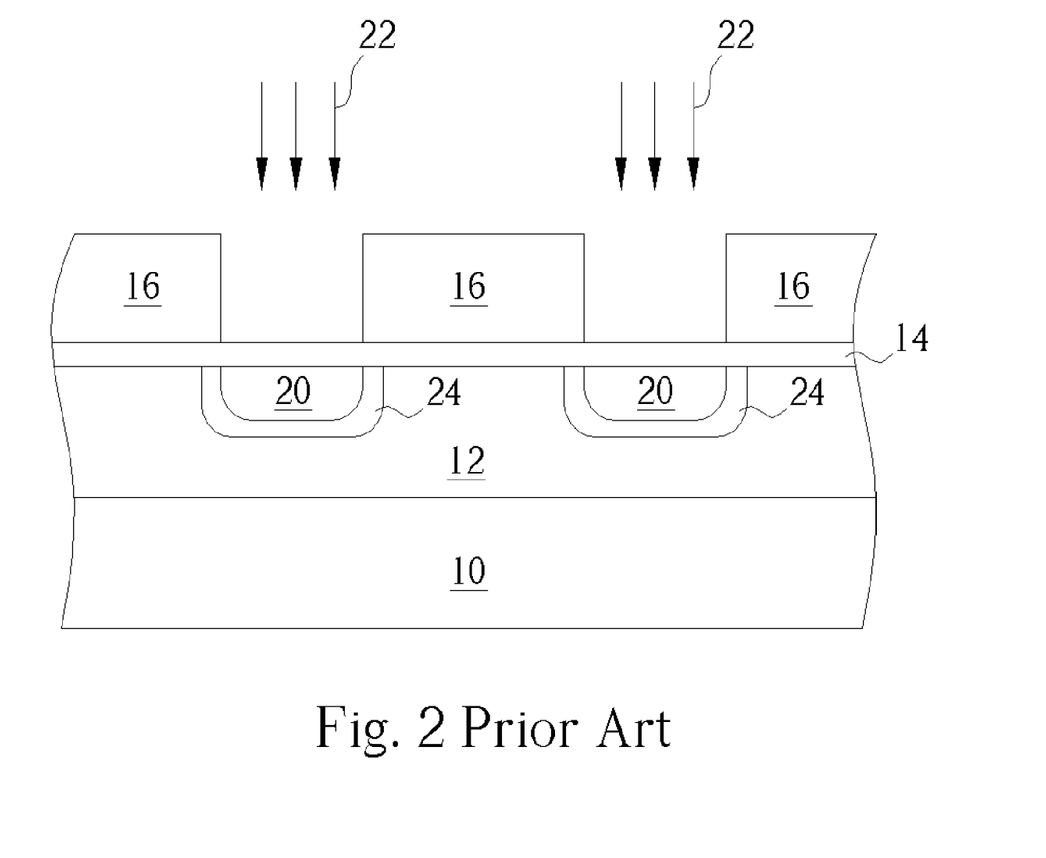
Figure 3:
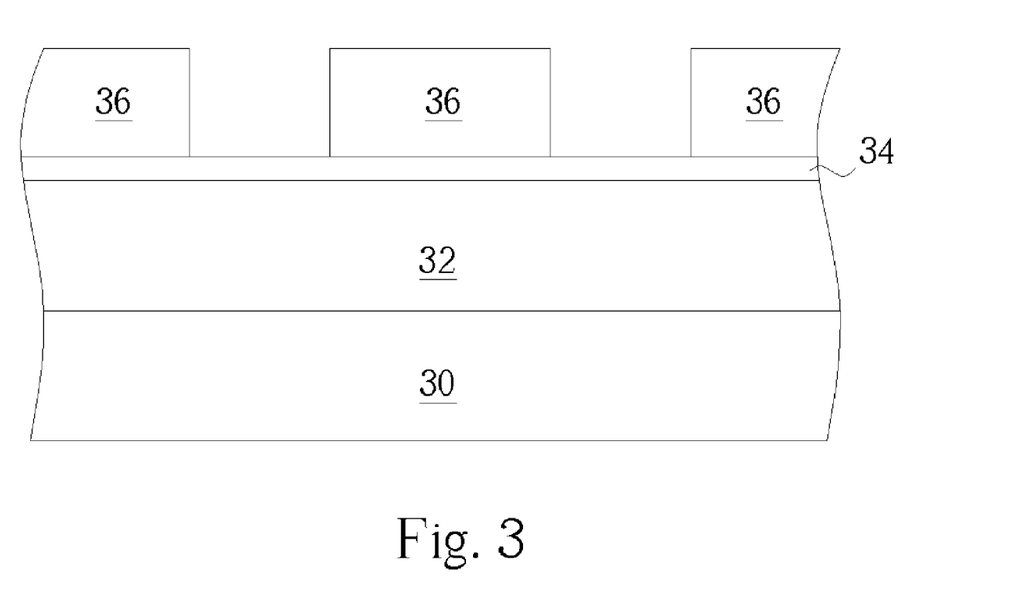
FIGS. 3 to 9 are sequential schematic diagrams showing a method for fabricating buried bit lines of a mask ROM according to the present invention.

Referring to FIG. 2, a CPT halo implantation process 22 is performed through the photoresist mask 16 to form halo regions 24 within the P-type well 12 encompassing the buried bit lines 20. A typical CPT halo ion implantation process 22 implants boron (B) ions at a dosage between $1.2 \times 10^{13}$ and $1.5 \times 10^{13}$ atoms/cm$^2$ and at an energy level between 100 and 140 KeV. This results in longer lateral diffusion areas 24, which encompass the buried bit lines 20. The lateral diffusion areas 24 are used to isolate the adjacent buried bit lines 20.

The conventional CRT halo ion implantation process 22 is utilized to form the halo regions 24, encompassing the buried bit lines 20 for reducing punch-through phenomenon between the adjacent buried bit lines 20. However, when the mask ROM dimension shrinks, the width of each buried bit line also shrinks and the sheet resistance of the buried bit line increases. In addition, the punch-through voltage between the adjacent buried bit lines becomes unacceptably low. Therefore, the high-dosage and the CPT halo ion implantation process 22 are not suitable for preventing punch-through phenomenon between the adjacent buried bit lines 20.

Another method for forming a lightly doped drain (LDD) by utilizing a polysilicon spacer as a mask is used to fabricate the word lines. Since the polysilicon spacer is difficult to remove, this method is unsuitable for the fabrication of the buried bit lines. As the integration of the IC and the shrinkage of the channel critical dimension continue, a method for fabricating a buried bit line of a mask ROM that can reduce the hot carrier effect is desired.

SUMMARY OF INVENTION

It is therefore an objective of the claimed invention to provide a method of fabricating buried bit lines of a mask ROM for reducing electric field strength between the adjacent buried bit lines and preventing punch-through phenomenon between the adjacent buried bit lines.

According to the claimed invention, the method for fabricating a buried bit line of a mask ROM includes providing a semiconductor substrate with a photoresist layer and patterning the photoresist layer to form a photoresist pattern. A first ion implantation process is performed to form a first doped region in the semiconductor substrate not covered by the photoresist pattern. Then, an organic layer is coated on the photoresist pattern and the semiconductor substrate, and an etching process is performed to form an organic spacer at two sides of the photoresist pattern. Finally, a second ion implantation process is performed to form a second doped region in the semiconductor substrate not covered by the photoresist pattern and the organic spacer, and the photoresist pattern and the organic spacer are stripped.

It is an advantage of the claimed invention that the organic spacer can be easily removed after forming the buried bit lines so that the channel critical dimension can be effectively reduced.

These and other objectives of the claimed invention will no doubt become obvious to those of ordinary skill in the art after reading the following detailed description of the preferred embodiment that is illustrated in the various figures and drawings.

DETAILED DESCRIPTION

FIG. 3 to FIG. 9 are schematic diagrams for fabricating buried bit lines of the mask ROM according to one preferred embodiment of the present invention. Please refer to FIG. 3. A semiconductor substrate 30 comprising a P-type well 32 is provided. The surface of the semiconductor substrate 30 is thermally oxidized to form a pad oxide layer 34 with a thickness normally between 125 and 250 Å. A photoresist layer (not shown) is coated on the pad oxide layer 34 and patterned as in the art to form a photoresist pattern 36.

Figure 4:
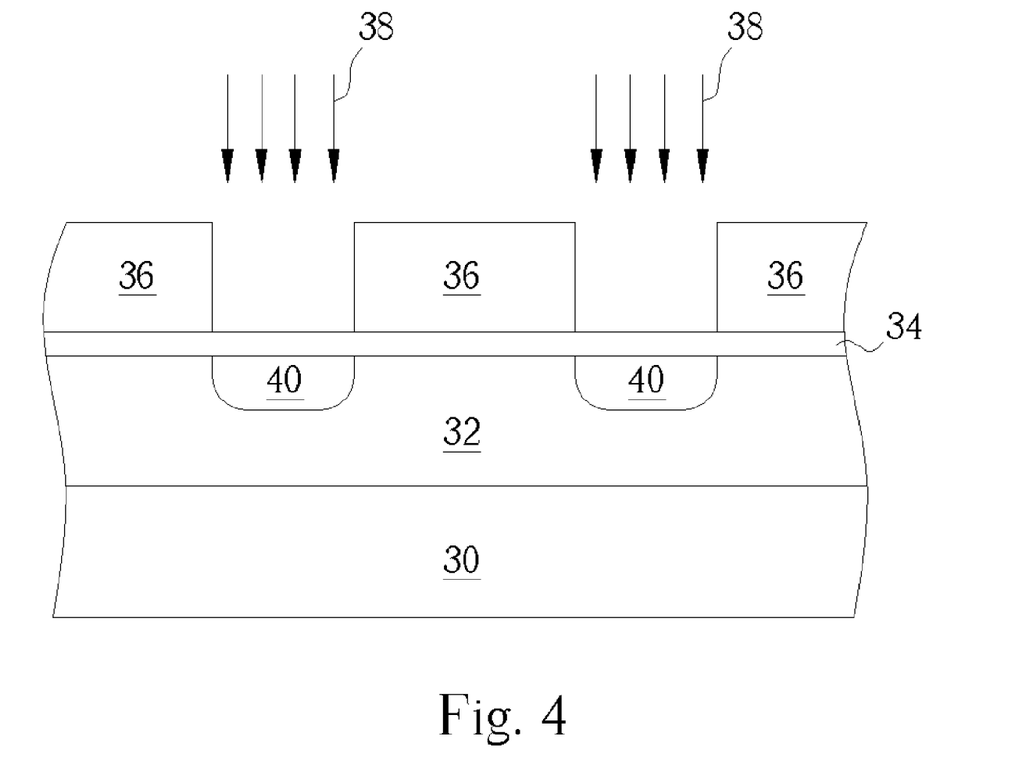

Please refer to FIG. 4, a first ion implantation process 38 is performed to form a first N-type or P-type doped region 40. The first doped region 40 is a lightly doped drain (LDD) region within the P-type well 32 not covered by the photoresist pattern 36.

Figure 5:
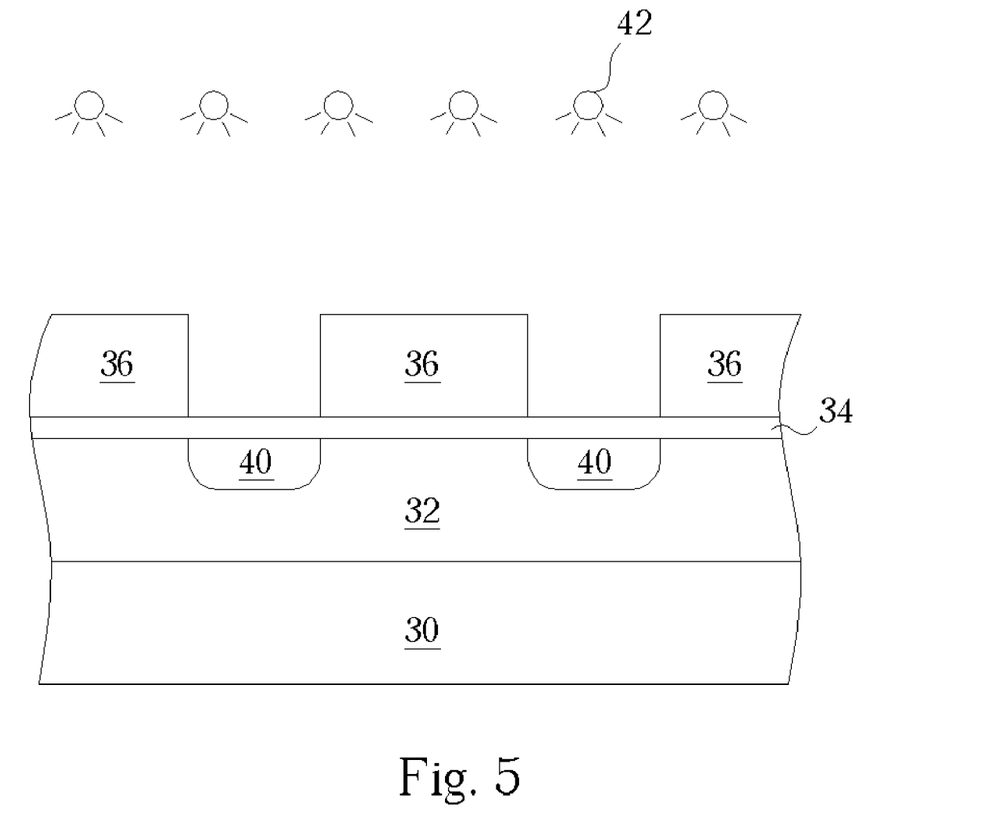
Figure 6:
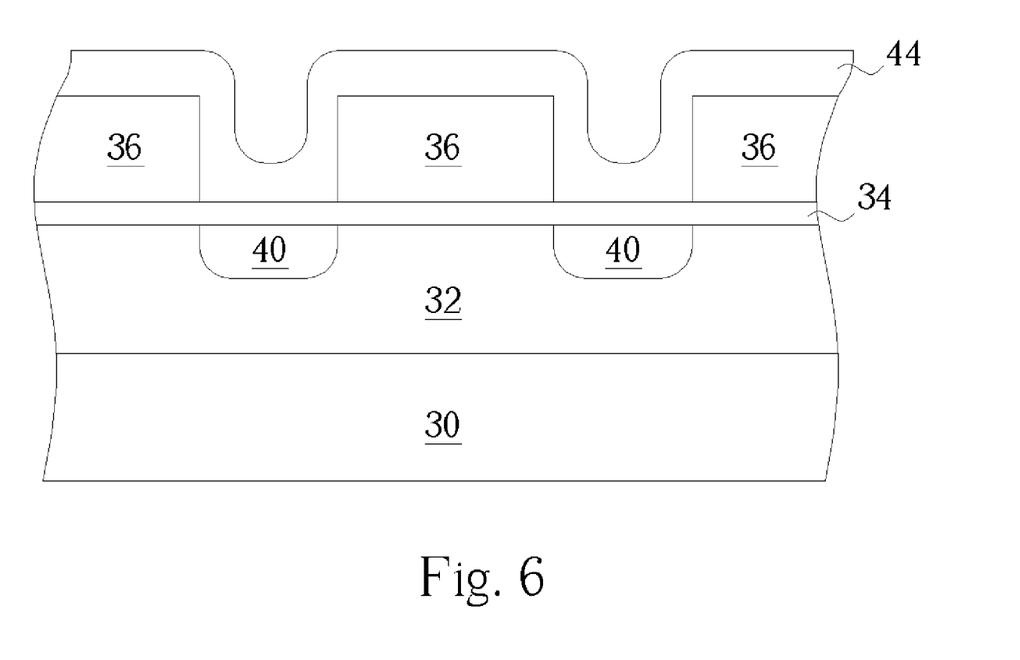
Figure 7:
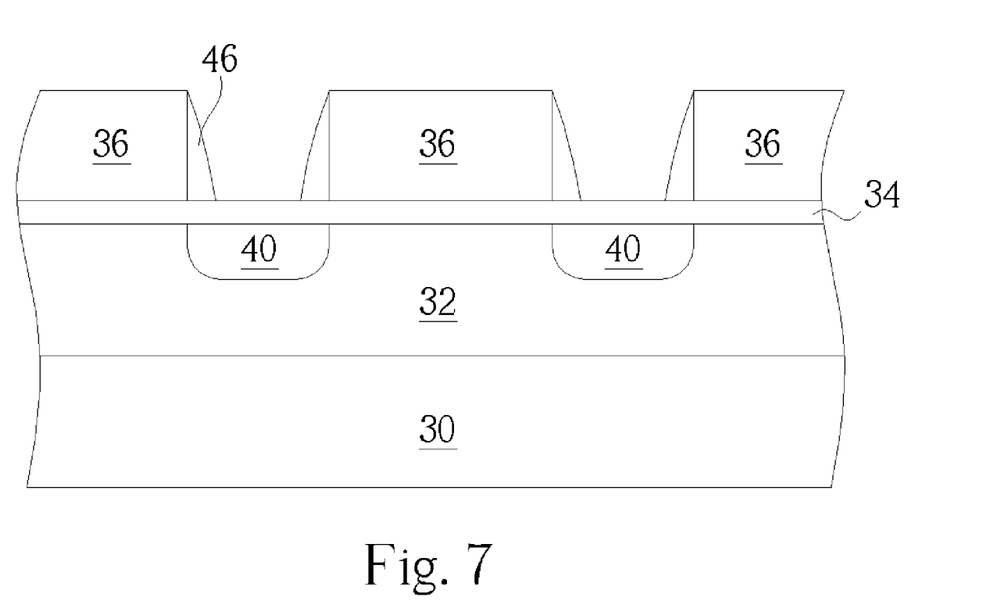

After forming the LDD region 40, as shown in FIG. 5, a hot treatment process 42 is performed to harden the photoresist pattern 36. Typically, the hot treatment process 42 is an UV curing process or a hot plate process. The photoresist pattern 36 is hardened for the following coating and etching processes. As shown in FIG. 6, a conformal organic layer 44 is coated on the thermally treated photoresist pattern 36. Typically, the material of the organic layer is a bottom anti-reflective coating (BARC). An etching back process is performed to etch the organic layer 44, so as to form an organic spacer 46, as shown in FIG. 7. The organic spacer 46 on each sidewall of the photoresist pattern 36 covers portions of the LDD regions 40. The etching back process is generally a dry etching process.

Figure 8:
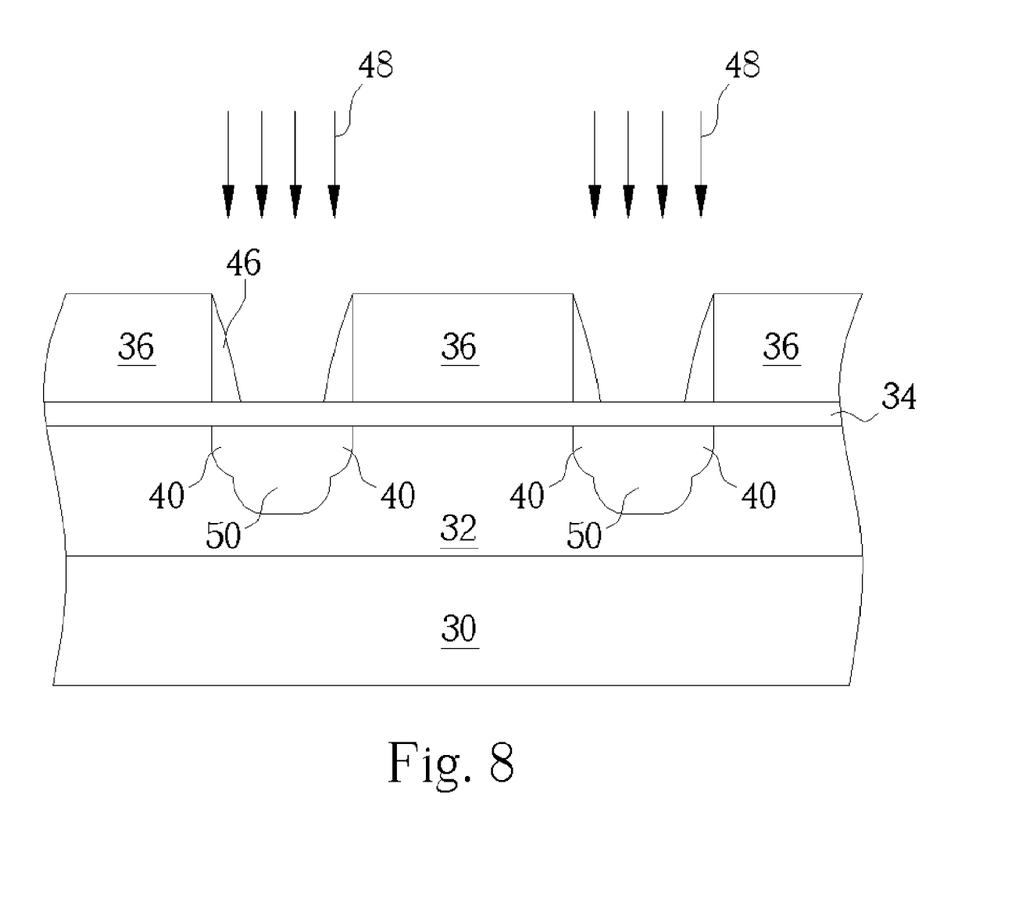

Please refer to FIG. 8. After forming the organic spacer 46, a second ion implantation process 48 is performed to form a second doped region 50. Typically, the second doped region is an $N^+$ doped region. Preferably, N type ions are implanted into the area that is not masked by the organic spacers 46 and the thermally treated photoresist pattern 36 at a dosage of between $1 \times 10^{15}$ and $1 \times 10^{16}$ atoms/cm$^2$ and at an energy level of between 50 and 100 KeV. As shown in the cross-sectional view in FIG. 8, two ends of the LDD regions 40 are shielded by the organic spacers 46 during the second ion implantation. The ion concentration at two ends of the LDD region 40 will be kept different from that at the second doped region 50. The low-dosage $N^+$ doped regions positioned at two sides of the buried bit lines formed by utilizing the organic spacer 46 as the mask are used to prevent the punch-through phenomenon between the adjacent buried bit lines.

Figure 9:
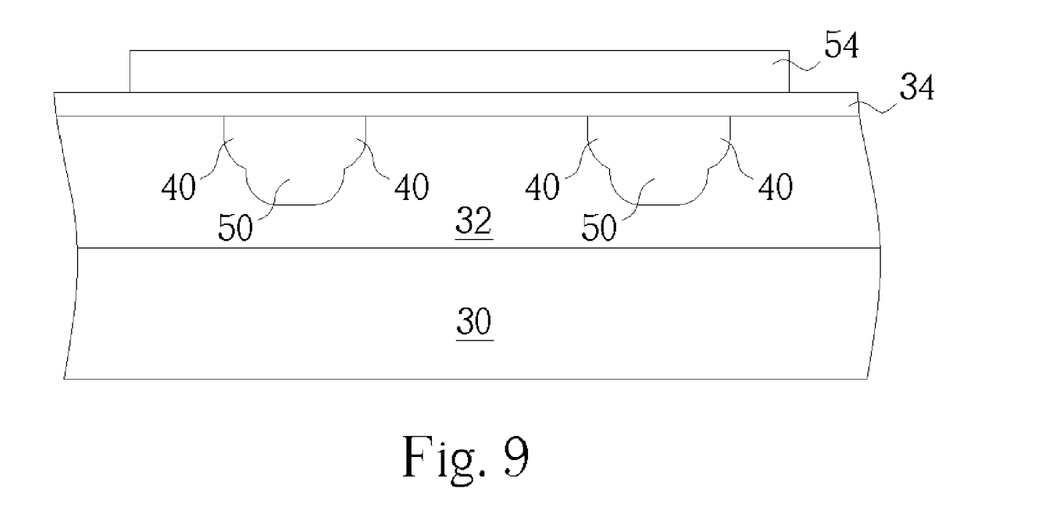

Referring to FIG. 9, the photoresist pattern 36, the organic spacer 46, and the pad oxide layer 34 are stripped. A gate oxide layer 52 with a thickness normally between 90 and 150 Å is formed on the semiconductor substrate 30. A polysilicon layer (not shown) is formed on the semiconductor substrate 30 and patterned to form a polysilicon gate, functioning as a word line 54 of the mask ROM.

In comparison with the conventional techniques, the present invention utilizes the region comprised of the LDD regions positioned at two sides of the doped region and the doped region as the buried bit lines of the mask ROM for reducing the buried bit lines electric field strength effectively and for reducing the hot carrier effect. The LDD region increases the punch-through voltage and prevents the punch-through phenomenon between the adjacent buried bit lines. In the present invention, the organic spacer is utilized to shield the LDD region while implanting ions. The photoresist pattern and the organic spacer are easy to strip; facilitating the following word lines process.

Those skilled in the art will readily observe that numerous modifications and alterations of the claimed method may be made while retaining the teachings of the invention. Accordingly, the above disclosure should be construed as limited only by the metes and bounds of the appended claims.

What is claimed is:

1. A method for fabricating a buried bit line of a mask ROM, the method comprising:

providing a semiconductor substrate with a photoresist layer coated on the semiconductor substrate;

patterning the photoresist layer to form a photoresist pattern;

performing a first ion implantation process to form lightly doped drain region in the semiconductor substrate not covered by the photoresist pattern;

forming an organic non-poly spacer on sidewall of the photoresist pattern;

performing a second ion implantation process to form a heavily doped region in the semiconductor substrate not covered by the photoresist pattern and the organic spacer, and stripping the photoresist pattern and the organic spacer.

2. The method of claim 1 further comprising performing a hot treatment process to harden the photoresist pattern after performing the first ion implantation process.

3. The method of claim 2 wherein the hot treatment process is an UV curing process or a hot plate process.

4. The method of claim 1 wherein the heavily doped region is an $N^+$ doped region.

5. The method of claim 1 wherein the organic layer is made of a bottom anti-reflective coating (BARC).

6. The method of claim 1 wherein the step of forming the organic spacer includes a step of performing a dry etching process.

7. A method for fabricating a mask ROM, the method comprising:

providing a semiconductor substrate with a photoresist layer coated on the semiconductor substrate;

patterning the photoresist layer to form a photoresist pattern;

performing a first ion implantation process to form a lightly doped drain region in the semiconductor substrate not covered by the photoresist pattern;

performing a hot treatment process to harden the photoresist pattern;

forming an organic non-poly spacer on sidewall of the photoresist pattern;

performing a second ion implantation process to form a heavily doped region in the semiconductor substrate not covered by the photoresist pattern and the organic spacer;

stripping the photoresist pattern and the organic spacer; and forming an insulating layer on the semiconductor substrate and an word line on the insulating layer.

8. The method of claim 7 wherein the hot treatment process is an UV curing process or a hot plate process.

9. The method of claim 7 wherein the heavily doped region is an $N^+$ doped region.

10. The method of claim 7 wherein the organic spacer is made of a bottom anti-reflective coating (BARC) material.

11. The method of claim 7 wherein the step of forming the organic spacer includes a step of performing a dry etching process.

* * * * *